(12) United States Patent
Mariani et al.

(10) Patent No.: US 8,277,896 B2
(45) Date of Patent: Oct. 2, 2012

(54) THIN FILM DIELECTRICS WITH PEROVSKITE STRUCTURE AND PREPARATION THEREOF

(75) Inventors: Robert D. Mariani, Douglassville, PA (US); John W. Koenitzer, Carlisle, MA (US)

(73) Assignee: Global Advanced Metals, USA, Inc., Waltham, MA (US)

( * ) Notice: Subject to any disclaimer, the term of this patent is extended or adjusted under 35 U.S.C. 154(b) by 1006 days.

(21) Appl. No.: 11/847,446

(22) Filed: Aug. 30, 2007

(65) Prior Publication Data

US 2007/0292613 A1  Dec. 20, 2007

Related U.S. Application Data

(62) Division of application No. 10/914,986, filed on Aug. 10, 2004, now abandoned.

(60) Provisional application No. 60/495,220, filed on Aug. 14, 2003.

(51) Int. Cl.
 *B05D 3/02* (2006.01)
(52) U.S. Cl. .................................................. 427/376.1
(58) Field of Classification Search ................. 427/376.1
 See application file for complete search history.

(56) References Cited

U.S. PATENT DOCUMENTS

| | | | |
|---|---|---|---|
| 2,922,730 A * | 1/1960 | Feldman | 427/126.2 |
| 3,502,598 A | 3/1970 | Nagase et al. | |
| 4,039,401 A * | 8/1977 | Yamada et al. | 205/384 |
| 5,721,182 A | 2/1998 | Reichert et al. | |
| 5,785,898 A | 7/1998 | Hofmeister et al. | |
| 5,846,505 A | 12/1998 | Saegusa | |
| 6,387,341 B1 | 5/2002 | Sarrade et al. | |
| 6,430,026 B1 | 8/2002 | Nagato et al. | |
| 6,548,169 B2 | 4/2003 | Tanaka et al. | |

FOREIGN PATENT DOCUMENTS

| | | |
|---|---|---|
| DE | 42 42 555 A1 | 6/1993 |
| DE | 102 37 291 A1 | 4/2003 |
| JP | 03-069586 | 3/1991 |
| JP | 08-167325 | 6/1996 |
| JP | 2003055048 | 3/2003 |

OTHER PUBLICATIONS

Toda et al. "Room Temperature Synthesis and Characterization of Perovskite Compounds" Solid State Ionics 154-155 (2002) p. 393-398. Available online Oct. 11, 2002.*

International Search Report and Written Opinion of the International Searching Authority for PCT/US2004/026090 dated Oct. 6, 2006.

International Preliminary Report on Patentability and Written Opinion of the International Searching Authority for PCT/US2004/026090 dated Nov. 1, 2006.

* cited by examiner

*Primary Examiner* — Nathan Empie
(74) *Attorney, Agent, or Firm* — Kilyk & Bowersox, P.L.L.C.

(57) ABSTRACT

Methods of making a ternary oxide and a perovskite-related ternary oxide structure are described. The methods include reacting a binary oxide with a metal oxide or a metal hydroxide to form a ternary oxide dielectric layer on a substrate. Powders, anodes, pressed articles, and capacitors including the ternary oxide or perovskite-related ternary oxide structure as a dielectric layer or other layers are further described.

7 Claims, No Drawings

THIN FILM DIELECTRICS WITH PEROVSKITE STRUCTURE AND PREPARATION THEREOF

This application is a divisional of U.S. patent application Ser. No. 10/914,986, filed Aug. 10, 2004, which in turn claims the benefit under 35 U.S.C. §119(e) of prior U.S. Provisional Patent Application No. 60/495,220 filed Aug. 14, 2003, which is incorporated in its entirety by reference herein.

BACKGROUND OF THE INVENTION

The present invention relates to perovskite-related materials and methods to make a perovskite-related structure, as well as to methods of making ternary oxide dielectric films and capacitors and other devices containing the films.

Dielectric films or layers are used in a variety of applications, such as anode production and capacitors. Typically, dielectric films comprised of binary metal oxides, such as $Ta_2O_5$ and $Nb_2O_5$, are formed on a metal substrate creating a metal-metal oxide interface. However, when using binary metal oxides, such as $Ta_2O_5$ and $Nb_2O_5$, the binary metal oxide can break down to form undesirable metal oxides, such as $NbO_2$, which can then diffuse across the interface into the metal anode, for instance. This is especially true in the case of $Nb_2O_5$, because the interface involving niobium is particularly sensitive to time and temperature. Moreover, the method for making the binary metal oxides generally involves several steps, which increases production costs.

Conventional binary metal oxide films have several disadvantages. First, a thermodynamic instability can exist between the substrate and the binary oxide dielectric interface, which often results in the formation of intermediate oxides. As a result of intermediate oxide formation, oxygen vacancies promote oxide-ion migration, which can affect the critical performance characteristics of the host device. For example, in capacitors, oxygen-ion vacancies facilitate space-charge polarization, dielectric loss, and low breakdown voltage. The above conditions are characteristic of a non-uniform, non-coherent, and/or non-mechanically sound dielectric film. Second, surface films of binary metal oxides often degrade, which affect the performance of devices into which the films are incorporated. Furthermore, high-temperature (e.g., above about 300° C.) processing typically used in formation of binary metal oxide films enhances oxide mobility and favors comproportionation even at a comparatively stable $Ta/Ta_2O_5$ interface. Both the reaction product and the enhanced oxygen mobility promote space charge polarization and dielectric loss.

With an ever-increasing demand for producing, at low cost, a dielectric film having a high thermodynamic stability of the substrate/dielectric interface, it is an important priority to provide a one-step perovskite-related ternary oxide film. Accordingly, a need exists to overcome one or more of the above-described disadvantages of conventional dielectric films.

SUMMARY OF THE PRESENT INVENTION

It is therefore a feature of the present invention to provide a ternary oxide dielectric perovskite-related ternary oxide structure.

Another feature of the present invention is to provide a dielectric that has an increased thermodynamic stability at the substrate/dielectric interface.

A further feature of the present invention is to provide a low temperature reaction to prevent or reduce oxide diffusion into the substrate when making the dielectric.

An additional feature of the present invention is to provide a low temperature reaction to prevent reaction of the substrate with impurities or solvents when making the dielectric.

Also, a feature of the present invention is to provide a high mobility/diffusion coefficient during film formation to promote rapid reaction.

Another feature of the present invention is to provide a reasonable dielectric constant of a reaction medium to promote ionic surface reactions.

Yet another feature of the present invention is to provide a dielectric film that is uniform, coherent, and stable.

Additional features and advantages of the present invention will be set forth in part in the description which follows, and in part will be apparent from the description, or may be learned by practice of the present invention. The objectives and other advantages of the present invention will be realized and attained by means of the elements and combinations particularly pointed out in the written description and appended claims.

To achieve these objectives and other advantages and in accordance with the purposes of the present invention, as embodied and broadly described herein, the present invention relates to a method of making a ternary oxide. According to one embodiment of the present invention, the method includes reacting a binary oxide with a metal oxide to form a ternary oxide dielectric layer on a substrate, wherein the metal oxide is different from the binary oxide. According to another embodiment, the method includes reacting a binary oxide with a metal hydroxide to form a ternary oxide dielectric layer on a substrate. According to another embodiment, the method includes reacting a binary oxide with a metal carbonate to form a ternary oxide dielectric layer on a substrate. Other metal materials can be used.

The present invention also relates to a method of making a ternary oxide dielectric by contacting at least one metal oxide and a binary oxide with a supercritical fluid and/or with a supercritical fluid and a co-solvent.

The present invention further relates to a method of making a ternary oxide dielectric by heating a metal material, for instance metal compound, (e.g., metal oxide, metal salt, metal hydroxide, metal halide, metal carbonate, or metal nitrate) at a temperature and a pressure sufficient to melt the metal material to form a molten metal material; and contacting the molten metal material to a binary oxide that is disposed on a substrate. The method may include stabilizing the film of binary oxide on the substrate, or the incipient ternary oxide dielectric, by the use of an applied voltage (faradaic or non-faradaic).

The present invention further relates to a method of making a ternary oxide dielectric by fusing a binary oxide with a metal material (e.g., metal hydroxide, metal oxide, or metal carbonate) to form a solid material upon cooling; dissolving the solid material in a first solution (e.g., aqueous); disposing the first solution, or a derivative of the first solution onto the substrate; and heating the substrate with the first solution, or an evaporated film of the solution, disposed thereon under vacuum. The substrate may be the metal constituting the binary oxide, a binary oxide film on a metal, or a different metal.

The present invention further relates to a method of making a ternary oxide dielectric by anodizing a binary oxide, wherein the binary oxide comprises an anode, in an electrolyte. The electrolyte is constituted by having some solubility for metal oxides.

The present invention further relates to a method of making a ternary oxide dielectric by anodizing a binary oxide, wherein the binary oxide comprises an anode, and contacting the binary oxide with at least one molten metal containing at least one dissolved oxide. The molten metal may be molten alkali metals, alkaline earth metals, or mixtures thereof.

The present invention further relates to substrates with ternary oxide films and articles using or having the same.

It is to be understood that both the foregoing general description and the following detailed description are exemplary and explanatory only and are intended to provide a further explanation of the present invention as claimed.

DETAILED DESCRIPTION OF THE PRESENT INVENTION

A method of making a ternary oxide according to the present invention preferably includes reacting a binary oxide with a metal oxide to form a ternary oxide dielectric layer on a substrate, wherein the metal oxide is different from the binary oxide. The method alternatively includes reacting a binary oxide with a metal hydroxide and/or metal carbonate to form a ternary oxide dielectric layer on a substrate. Other metal materials can be used. In the present invention, more than one type of metal material can be used, and/or more than one type of binary oxide can be used.

For purposes of the present invention, a ternary oxide is any three element containing compound that is an oxide, for example, $LiNbO_3$, $KNbO_3$, $KTaO_3$, $BaTiO_3$, $NaNbO_3$, $NaTaO_3$, combinations thereof, and the like. It can be represented by the formula, for example, $AMO_3$, where A can be at least one alkali metal or alkaline earth metal and M is at least one metal. The perovskite-related ternary oxide may also be a solid solution of one or more ternary oxides. The solid solution is not a mixture. A mixture can be separated by physical methods. Three examples are given. For example, the ternary oxide can be a solid solution of $NaNbO_3$ and $KNbO_3$, which would be written as $Na_xK_{(1-x)}NbO_3$ by convention. In general, the stoichiometric variable x can range from zero to one. The sites that normally hold sodium ions ($Na^+$) are partially substituted for by potassium ions ($K^+$). A second example is a solid solution of $KTaO_3$ and $KNbO_3$, e.g., $KTa_xNb_{(1-x)}O_3$. A third example is a solid solution of four ternary oxides, e.g., $Na_xK_{(1-x)}Ta_yNb_{(1-y)}O_3$. In the third example, the stoichiometric coefficients x and y are independent. For example, the coefficient x can be varied without altering y. In general, the variable y can range from zero to one, including decimals thereof (e.g., 0.1, 0.2, 0.3, etc . . . ).

The binary oxide in the present invention can be any binary oxide (i.e., any two element containing compound that is an oxide). The preferred binary oxides in the present invention are transition metal oxides, refractory metal oxides, and/or valve metal oxides, that are capable of reacting with a metal oxide to produce the desired ternary oxide. Examples of such binary oxides are TaO, NbO, $Nb_2O_5$, $Ta_2O_5$, and $TiO_2$. Other examples include other valve metal suboxides. It is preferred to use a high-purity binary oxide to avoid introduction of impurities when contacting the binary oxide to the supercritical fluid containing the metal oxide. Accordingly, the binary oxide preferably has a purity of at least about 95% and more preferably at least about 99% or more.

The binary oxide in the present invention can also be a solid solution of two or more binary oxides. Here again, a solid solution is not a mixture. An example for two binary oxides is a solid solution of $Nb_2O_5$ and $Ta_2O_5$, which by convention can be written as $Ta_{2x}Nb_{(2-2x)}O_5$. Here again the stoichiometric variable x may take the values ranging from zero to one, including decimals thereof (e.g., 0.1, 0.2, 0.3, etc . . . ).

The substrate in the present invention, which can include the binary oxide on its surface, can be any shape or size, such as, but not limited to, plate, block, pellet, can, anode, filament, and the like. The substrate can be a valve metal substrate, a refractory metal substrate, a conductive metal substrate, alloys thereof, and the like. Examples are Ta, Nb, Al, Ti, Zr, and the like. The substrate can also be a valve metal suboxide such as NbO and the like. Numerous examples are described in U.S. Pat. Nos. 6,759,026; 6,462,934; 6,416,730; and 6,322,912. The valve metal suboxide typically has an atomic ratio of metal to oxygen of 1: less than 2.5. The substrate can be a pressed metal substrate. Examples of such preferred substrates include foil or a sponge made from materials, such as Nb, Ta, and Ti. Substrates having a layer of binary oxides are commercially available. Preferably, the metal present in the binary oxide is the metal in the substrate. Preferably, the substrate is made of pure metal or alloys thereof or oxides thereof with or without dopants present. The substrate can be an anode or pressed powder. All patents/publications mentioned herein are incorporated in their entireties by reference herein.

The metal oxide used in the present invention can be in any shape or size. Preferably, the metal oxide has a shape and size sufficient to at least partially be soluble or suspended in a supercritical fluid. The metal oxide can be dissolved, at least partially, in the supercritical fluid. Generally, a minimal solubility is at least achieved to obtain a desired reaction. As such, the metal oxide is preferably in the form of a powder or a plurality of particles. Examples of the types of powders that can be used include, but are not limited to, flaked, angular, spherical, nodular, and blends thereof, and with shapes or variations thereof. Examples of such preferred starting metal oxide powders include those having mesh sizes of from about −10 to about −300 mesh and, more preferably, from about −10 to about −200 mesh.

The metal oxide used in the present invention can be a product of the decomposition and/or dissociation of a source compound. Preferably, the source compound decomposes and/or dissociates into the metal oxide and a by-product. Preferably, the by-product is not deleterious to the formation of the perovskite-related ternary oxide. For example, the metal oxide can be $Na_2O$ and the source compound can be $Na_2CO_3$ and the by-product can be $CO_2$. For this example, the decomposition/dissociation reaction can be written $Na_2CO_3 \rightarrow Na_2O + CO_2$.

Preferably, the metal oxide is different from the binary oxide. Preferably, the metal oxide is made from any material that can at least be partially suspended or solubilized or dissolved in the supercritical fluid and can effectively react with the binary oxide to form the desired ternary oxide.

The binary oxide can be in a shape and a size to effectively combine with a metal hydroxide or other metal material. The binary oxide can be in the form of a powder, or as a solid film on a substrate. Preferably, the ratio of the metal oxide to the binary oxide can range from about 1:3 to 3:1, such as about 2:1, 1:1, or 2:3. Preferably, when the binary oxide contains or is made from tantalum and/or niobium, the metal oxide of the present invention is an alkali metal oxide. Preferably, when the binary oxide contains or is made from titanium, the metal oxide of the present invention is an alkaline earth metal. Other metal oxides can also be used alone or in addition to the alkali metal oxide. It is preferred to use a high-purity metal oxide to avoid introduction of impurities when contacting the metal oxide with the binary oxide. Accordingly, the metal oxide preferably has a purity of at least about 95%.

Preferably, when the binary oxide is made from niobium and/or tantalum, the preferred metal oxides are $K_2O$, $Na_2O$, and/or $Li_2O$, and when the binary oxide is made from titanium, the preferred metal oxide is BaO. Preferably when the binary oxide is made from niobium and/or tantalum, the source compound that decomposes and/or dissociates into the metal oxide is $Na_2CO_3$, $K_2CO_3$, and/or $Li_2CO_3$. Preferably, when the binary oxide is made from titanium, the source compound that decomposes and/or dissociates into the metal oxide is $BaCO_3$.

The metal hydroxide can be any metal hydroxide capable of combining with a binary oxide. Preferably, the metal hydroxide is any material capable of fusing with the binary oxide. Preferably, the metal hydroxide is an alkali hydroxide. Other metal hydroxides can also be used alone or in addition to the alkali hydroxide. It is preferred to use a high purity metal hydroxide to avoid introduction of other impurities when combining the metal hydroxide with the binary oxide. Accordingly, the metal hydroxide has a purity of at least about 95% and more preferably at least about 99%.

The metal hydroxide can be in any shape or size. For instance, the metal hydroxide can be in the form of a powder or plurality of particles. Examples of the types of powders that can be used include, but are not limited to, flaked, angular, spherical, nodular, and variations or combinations thereof. Preferably, the metal hydroxide is in a shape and a size that can effectively be combined with the binary oxide. Preferably, the metal hydroxide is in a form of a powder, which more effectively combines/fuses with the binary oxide. In lieu of metal hydroxide, other metal materials as described above can be used alone or in combination. Examples of such preferred starting metal hydroxide powders include those that have a mesh size of from about 60/100 to about 100/325 mesh and from about 60/100 to about 200/325 mesh. Another range of size is from about 40 mesh to about −325 mesh. The other examples of metal materials can have similar properties and/or parameters and/or characteristics.

According to one embodiment, the present invention includes contacting at least one binary oxide on a substrate with a metal oxide present in a supercritical fluid, wherein the metal oxide is different than the binary oxide.

Another method to make the ternary oxide dielectric of the present invention is by contacting at least one metal oxide and at least one binary oxide on a substrate with the supercritical fluid and a co-solvent. The co-solvent can be added before, during, and/or after adding the supercritical fluid. The co-solvent can be added via an inlet that is separate from the inlet for the supercritical fluid, or it may be added in the same inlet as the supercritical fluid. The co-solvent can be premixed with the supercritical fluid. The presence of the co-solvent can enhance the transport and reaction rates for the metal oxide with the binary oxide. Examples of metal oxides are the oxides themselves (e.g., $Na_2O$) or compounds capable of generating or decomposing into metal oxides (e.g., $Na_2CO_3$, or NaOH, among others.) Examples of co-solvents are water and methanol. On a volume basis, the preferred amount of co-solvent present in relation to the supercritical fluid is from about 0.001 to 10% by volume. More preferably, the amount of co-solvent in relation to the supercritical fluid is from about 0.01 to 1% by volume.

The supercritical fluid is preferably any supercritical fluid capable of at least partially solubilizing, suspending, or dissolving the metal oxide. Preferably, the supercritical fluid that contacts the metal oxide and the binary oxide is polar and/or is used in the presence of a co-solvent. A polar supercritical fluid has a reasonable dielectric strength, which enhances its ability to dissolve ionic materials such as the metal oxide. However, supercritical fluids of the present invention can also be non-polar, such as supercritical $CO_2$. Examples of supercritical fluids that may be used in the present invention are HCl, $H_2O$, $NH_3$, $SO_2$, $CO_2$, and CO. The critical temperatures and pressures of the some supercritical fluids are shown below.

| Species | $T_c$(K) | $T_c$(C) | $P_c$(Mpa) | $P_c$(~psi) |
|---|---|---|---|---|
| HCl | 324.7 | 52 | 8.31 | 1220 |
| $H_2O$ | 647.1 | 374 | 22.06 | 3200 |
| $NH_3$ | 405.5 | 132 | 11.35 | 1670 |
| $SO_2$ | 154.6 | −118 | 5.043 | 741 |
| $CO_2$ | 304.1 | 30.9 | 7.735 | 1138 |
| CO | 132.9 | −140 | 3.499 | 510 |

Although the above-mentioned supercritical fluids may be used, certain supercritical fluids are more common in use than others, namely supercritical $CO_2$, supercritical CO, and supercritical $H_2O$. The critical temperature and pressure for $CO_2$ and CO are considerably less than those of $H_2O$, and thus the equipment requirements and capital expenses are less compared to those that use supercritical water. Batch reactions may be performed, for instance, with supercritical $CO_2$, HCl, CO, or $NH_3$ while maintaining the same margin of pressure safety.

Purification steps can be performed on the ternary oxide film that is formed on the substrate. These purification steps may include acid washing and water washing to remove any impurities. The acid used for the purpose of removing the impurities from the ternary oxide film can be any acid capable of removing impurities from the ternary oxide film. Preferably, the acid is HF, $HNO_3$, HCl, or $H_3PO_4$. The acid can have any pH that is capable of removing the impurities. Preferably, the acid has a pH of from about 0 to about 5. Similar to acid washing, water can also be used to remove the impurities.

In another technique for making a ternary oxide dielectric, a reactant is combined with at least one supercritical fluid. Preferably, the reactant can be any composition that provides a base metal for the ternary oxide and can be solubilized, suspended, or dissolved in the supercritical fluid and react with the metal oxide. The reactant can also be a gas that can be mixed in the supercritical fluid. Preferably, the metal part of the reactant is different than the metal of the metal oxide. Preferably, the metal of the reactant is a transition metal element. One example of such a reactant is $TaC_5$. It is preferred to use a high-purity reactant to avoid introduction of impurities when contacting the reactant with the metal oxide. Accordingly, the reactant preferably has a purity of at least about 95%, and more preferably at least about 99%.

This method also includes water that is premixed with the supercritical fluid. Alternatively, water may be added separately from the supercritical fluid, before and/or after addition of the supercritical fluid. The water is added for purposes of providing an oxide source for the ternary oxide. It is preferred to use a high-purity water to avoid the introduction of impurities during the reaction. Accordingly, the water preferably has a purity of at least about 99%.

The present invention, as an option, permits the use of low temperatures to make a ternary oxide dielectric with a perovskite structure which prevents oxide diffusion and reaction of the substrate with impurities or solvents.

Substrates having a binary oxide layer are commonly available and can be obtained with the desired specifications. Alternatively, a substrate, such as an anode, can easily have a desired binary oxide layer formed on its surface using conventional methods, such as applying a voltage to form an anodic film. Substrates may also be relatively free of binary oxide layer, insofar as is possible by cleaning with aqueous acids (e.g., HF). When preparing the metal oxide that is not of a sufficient size to effectively include in the supercritical fluid, the metal oxide can be crushed to a sufficient size in order to more effectively dissolve in the supercritical fluid.

The supercritical fluid can be any supercritical fluid depending on the desired characteristics of the final ternary oxide. Examples include HCl, $H_2O$, $NH_3$, $SO_2$, $CO_2$, CO, and the like, or combinations thereof. In one method, a gas is first introduced into an evacuated chamber. More preferably, the evacuated chamber is the reactor wherein the prepared metal oxide and the substrate having a layer of binary oxide are placed. The temperature and the pressure of the gas inside the chamber are then increased to at least a temperature and a pressure sufficient for the gas to reach its supercritical stage. Preferably, the temperature of the gas is increased at a rate of from about 1° C./minute to about 20° C./minute until the gas reaches its supercritical temperature. In the preferred embodiment, the temperature of HCl is increased to at least about 52° C., the temperature of the $H_2O$ is increased to at least about 374° C., the temperature of $NH_3$ is increased to at least about 132° C., the temperature of $SO_2$ is increased to at least about −118° C., the temperature of $CO_2$ is increased to at least about 30.9° C., and the temperature of CO is increased to at least about −140° C. In the preferred embodiment, the pressure of the gas is increased at a rate by adding the requisite amount of gas so that desired supercritical pressure is obtained at the desired supercritical reaction temperature. Preferably, the pressure of the HCl is increased to at least about 1220 psi, the pressure of the $H_2O$ is increased to at least about 3200 psi, the pressure of $NH_3$ is increased to at least about 1670 psi, the pressure of $SO_2$ is increased to at least about 741 psi, the pressure of $CO_2$ is increased to at least about 1138 psi, and the pressure of CO is increased to at least about 510 psi. Other pressures and conditions can be used.

In preparing the ternary oxide dielectric, the size of the metal oxide can be reduced (e.g., crushed) to a desired size and can be placed in a reactor. Preferably, it is placed in the reactor at a location that can easily be uptaken by the supercritical fluid. More preferably, the metal oxide is placed at the bottom of the reactor. The binary oxide, which is on a substrate, can also be introduced into the reactor at any time. For example, it can be introduced to the reactor before, during, and/or after the metal oxide is placed in the reactor. The supercritical fluid can also be introduced into the reactor at any time. Preferably, a gas is introduced into the reactor after the metal oxide and the substrate having a layer of binary oxide have already been introduced into the reactor. The gas can then be brought to its supercritical state. Although the order of adding the supercritical fluid, the metal oxide, or the substrate having at least one layer of binary oxide to the reactor is not critical, preferably, the supercritical fluid is added to the reactor after the metal oxide and the substrate having at least one layer of binary oxide are introduced into the reactor.

Once the gas reaches its supercritical state, the supercritical fluid preferably at least partially solubilizes, suspends, or dissolves the metal oxide and transports/carries or otherwise contacts the metal oxide with the binary oxide located on the surface of the substrate. Because the supercritical fluid preferably has a low viscosity, high mobility, and/or high diffusion coefficient, the supercritical fluid speeds up the process of transporting the metal oxide to the binary oxide on the surface of the substrate. The metal oxide in the supercritical fluid can then react with the binary oxide located on the surface of the substrate to produce a perovskite-related dielectric film. The geometry, size, and stability of the dielectric film on the substrate can depend on the temperature and the pressure of the supercritical fluid.

Once the ternary oxide film is formed, the supercritical fluid can then be removed or the substrate can be removed. The substrate having the ternary oxide film can optionally be subjected to acid washing and/or water washing or other cleaning techniques to remove any impurities. Preferably, the acid washing and the water washing are performed for a sufficient time to remove all of the impurities from the ternary oxide film. The high stability of the ternary oxide film permits the use of a fairly aggressive washing media at room temperature. Annealing at elevated temperatures may also be conducted to enhance performance characteristics. For example, the process can be carried out under high vacuum and the coefficients of thermal expansion are compatible for the film and the substrate.

The ternary oxide dielectric/perovskite related structure can also be obtained by using a source compound that releases gas (e.g., $Na_2CO_3 \rightarrow Na_2O+CO_2(gas)$) as the reaction progresses. The gas pressure inside the reactor can be allowed to increase as the reaction progresses, or a portion of the gas can be vented to maintain the reactor at a marginally constant pressure (e.g., the desired operating pressure, in psi, +/−100 psi).

When using a source compound that releases gas as the reaction progresses and the gas is vented, a co-solvent may also be used. Since some of the co-solvent will be vented with the gas, additional co-solvent may be added as the reaction progresses to make up for the co-solvent that is vented. Alternatively, additional make-up co-solvent may not be added, and the content of co-solvent present in the supercritical fluid may diminish as the reaction progresses. For example, the content of co-solvent may diminish from the initial content (e.g., 1% by volume) to a lesser content (e.g., 0.1% by volume)

According to another embodiment, the present invention includes heating a metal material at a temperature and a pressure sufficient to melt the metal material to form a molten metal material, and then contacting the molten metal material with a binary oxide, wherein the binary oxide is disposed on the substrate. The metal material may be a metal oxide, metal salt, metal halide, metal hydroxide, metal carbonate, or metal nitrate, or combinations thereof. The molten metal material (e.g., LiOH) preferably has some capacity to dissolve at least some metal oxide (e.g., $Li_2O$) for reaction with the binary oxide (e.g., $Nb_2O_5$).

In preparing the metal material, if needed, it is crushed to a size sufficient to effectively melt and produce a molten material. Preferably, the metal material is reduced into powder to produce more surface area. The metal material can be subjected to two or more crushings to achieve the desired uniform particle distribution for it to effectively melt and produce the preferred molten metal material. Some examples of such metal material include salts, such as KOH, NaF, $Ba(OH)_2$, $Li_2CO_3$, $Li_2O$, and $K_2O$. The metal material can then be heated to a sufficient temperature and for a sufficient time and at a sufficient pressure to melt the metal material.

Because it is desirable to have a high concentration of the metal oxide in the molten metal material, it is preferable to add other compositions that are capable of increasing the concentration of the oxide in the melt. Such additional composition can include other metal oxides that may or may not be identical to the metal oxide, for example, $Li_2O$ in LiOH. The additional composition can be a size and a shape sufficient to increase the concentration of the metal oxide in its molten state. Preferably, the size of this additional composition is macroscopic.

The binary oxide can be in a form of a film on the surface of the substrate. Preferably, the binary oxide is stabilized on the surface of the substrate using any suitable method. Preferably, the stabilizing method used changes the activity of the binary oxide relative to the molten metal oxide to stabilize the binary oxide on the surface of the substrate. Alternatively, the stabilizing method used changes the activity of the incipient ternary oxide. One method involves an electrical polarization process, for example. A voltage can be applied to the substrate with the binary oxide, with the voltage related to the free energy difference between the ternary and binary oxides.

The ternary oxide dielectric of this method can be formed by contacting the binary oxide with molten metal oxide in a reactor, preferably a crucible reactor. The reactor is heated to a temperature sufficient for the binary oxide film to uptake the metal oxide of the molten metal oxide to produce a ternary oxide. Preferably, the molten metal oxide and the binary oxide on the surface of the metal substrate are heated to a temperature of from about 150 to about 1200° C., and more preferably from about 250 to about 800° C. The binary oxide and the molten metal oxide are preferably reacted at a pressure of from about vacuum to about 2 atmosphere absolute, and for a time sufficient for the binary oxide film to uptake the metal oxide to form the desired ternary oxide. Preferably, the reaction time is from about 1 to about 36 hours. However, the reaction time can vary significantly depending on the binary oxide and the molten metal oxide.

According to another embodiment, the present invention includes contacting a binary oxide with the metal material and fusing them together upon heating, which forms into a solid material upon cooling; dissolving the solid material in a first solution, and disposing the first solution, or a derivative of the first solution onto a substrate; and heating the substrate having the solution disposed thereon under vacuum.

Metal materials, such as metal hydroxides, and preferably alkali hydroxides, are commercially available. Alternative metal material, as stated earlier, can include metal oxides, metal carbonates, and the like. If the metal material is not of a sufficient size to effectively be combined or fused with the binary oxide, the metal material can be crushed. If needed, the metal material can be subjected to two or more crushings to achieve the desired particle size and distribution. The metal material is then preferably subjected to milling in order to obtain a desired particle size, which is of sufficient size to combine and fuse effectively with the binary oxide.

The binary oxide and the metal material can be mixed in a ratio sufficient to produce the final desired product. Preferably, the ratio of the binary oxide to metal material is about 1:1 or the amount of metal material can be higher. More preferably the ratio of binary oxide to the metal material is from about 1:1 to about 1:3. The mixture of the binary oxide and the metal material can then be heated at a sufficient temperature for a sufficient time for the binary oxide and the metal material to combine or fuse. Preferably, the binary oxide and the metal material are heated to at least the melting point of the composition having the lower melting point.

The solid material formed by fusing the binary oxide and the metal material can be cooled to room temperature (e.g., 25° C.) and can be dissolved in a first solution (e.g., water or ethanol, mixtures of the two, or others). In preparing the solid material to be dissolved in the first solution, if helpful, the solid material can be crushed to a size sufficient to effectively be dissolved in the first solution. Preferably, the solid material is crushed into powder to produce more surface area to be more effectively dissolved in the first solution. If desired, the solid material can be subjected to milling in order to obtain the desired particle size to more effectively be dissolved in the first solution.

The first solution used to dissolve the solid material is preferably water. Other solutions can be used. The minimum amount of the first solution should be sufficient to dissolve most or all of the solid material. The first solution that dissolves the fused material can have a pH of from about 1 to about 13. Depending on the pH of the solution, different complex oxides can be formed.

The first solution can then be derivatized by dilution or by addition of a second solvent (e.g., ethanol and the like). Preferably the fused solid material, in the first solution is then disposed or casted onto a substrate, preferably a conductive substrate, to form a film. Any suitable method for casting the aqueous solution on the metal substrate can be used. For instance, the substrate can be dipped into the solution. Another method is to spray the solution on the substrate. Another method is to spin coat the substrate with the solution. Other methods of disposing the aqueous solution onto the metal substrate are well known in the art.

The ratio of the solution to the surface of the substrate can depend on the application of the final product. The thickness of the film can be controlled by any suitable method, for example, a multiple coating method. In the multiple coating method, depending on the desired thickness of the film, one or multiple coatings are applied to the surface of the metal substrate. Another method to control the thickness of the film is by modifying the viscosity of the solution. This can be accomplished by varying the ratio of the fused solid material and the first solution that is capable of dissolving the fused solid material. A higher viscosity solution forms a thicker film on the substrate. Additionally, modifying the surface tension of the solution can also affect the thickness of the film formed on the substrate. The surface tension depends on the concentration of the solution. Other methods to control the thickness of the film are well known in the art.

The metal oxide containing the solution can be heated to a temperature sufficient to convert the solution having complex oxides to a ternary oxide dielectric. The upper temperature limit can depend on the oxidizing conditions. Preferably, a metal substrate having at least one layer of solution is heated to a temperature of from about 150 to about 1400° C. Preferably, moderate temperatures (e.g., from about 150 to about 300° C.) are used when heating the metal substrate with at least one layer of the solution in an air containing atmosphere. Moderate temperatures are used under these conditions because at higher temperatures the oxygen in the air atmosphere promotes oxidization of the electrically conductive substrate instead of converting the binary oxide to a ternary oxide. Higher temperatures, up to about 1400° C., for instance, can be used when heating the conductive substrate having at least one layer of solution under vacuum conditions. It is preferred to heat the film on the substrate under vacuum conditions because there is no oxygen in the atmosphere to promote oxidization of the metal substrate and thus, only the binary oxide reacts with the metal material to produce a ternary oxide dielectric film.

The substrate having at least one layer of solution is heated for a time sufficient to form a uniform ternary oxide dielectric film and to satisfy the functional characteristics of the application. Preferably, the substrate and its film are heated from about 1 hour to about 36 hours, and more preferably are heated for about 1 hour to about 6 hours. Preferably, the heating rate is controlled until all of the water in the second solution is evaporated and/or until any excess oxide(s) is vaporized. More preferably, the heating rate is from about 5 to about 50° C./min until most or all the water in the aqueous solution is evaporated. The heating rate can be accelerated until the desired temperature and/or proper characteristics of the desired ternary oxide film is produced.

According to another embodiment, the present invention includes making a ternary oxide dielectric by anodizing a metal to produce a binary oxide or layer on the metal, wherein the metal/binary oxide can be an anode. One way to obtain the ternary oxide is by contacting the binary oxide with a molten metal containing one or more dissolved oxides. The molten metal may be molten alkali metals, alkaline earth metals, or mixtures thereof.

Anodization to produce the binary oxide on a substrate may be performed by an electrochemical method, as is familiar to those skilled in the art of producing dielectrics by anodization. The substrate is then contacted in a molten metal for 1 or less to 36 hours or more, preferably, 1 to 4 hours. The substrate may be a foil, filament, or pressed part comprising powder or filaments.

The molten metal preferably is alkali metals, alkaline earth metals or mixtures thereof. The molten metal may be a bath that the substrate is immersed in, or a film formed on the substrate by condensation of the metal vapor. The molten metal is exposed to oxygen gas or air to produce metal oxides. Preferably, the amount of oxygen or air is less than or equal to the amount of metal oxide that is soluble in the molten metal. Upon forming the solution of metal oxide in the molten metal, the dissolved metal oxide then reacts with the substrate comprising the binary oxide to form the ternary oxide.

According to another embodiment, the present invention includes anodizing a binary oxide, wherein the binary oxide is an anode or pressed body, and the metal material is an electrolyte. The metal material may be, but is not limited to, a metal hydroxide, metal carbonate, or metal oxide, or mixtures thereof. The anodizing preferably occurs in an electrolyte, which preferably has some solubility for the metal oxide. Examples of electrolytes are metal oxides, metal hydroxides, metal carbonates, metal halides, and metal nitrates, among others.

Anodizing can be achieved by any suitable method, for example, by passing an electrical charge between a first electrode and a second electrode which are disposed in an electrolyte. In this process, a first electrode can be partially or entirely made from a binary oxide, such as NbO. The first electrode is placed into the electrolyte, preferably a metal hydroxide, and more preferably, a molten salt. A second electrode which can be an inert electrode, can also be placed in the same electrolyte. In the preferred embodiment, the first electrode can be made from any electrically conductive substrate that includes a layer of the binary oxide. To initiate the reaction, an oxide can be added to the electrolyte, and a current is passed between the first and second electrodes. Once the reaction starts, excess oxides are generated which eliminates the need to introduce more oxides to maintain the reaction. The reaction causes the binary oxide electrode or the electrode substrate having a layer of binary oxide to uptake the metal oxide in the electrolyte to produce a layer of ternary oxide. The thickness of the ternary oxide dielectric layer can be controlled and determined by the charge, current, or voltage passing between the first electrode and the second electrode.

A similar process can also be used to produce ternary oxide dielectric. In this process, a binary oxide pellet(s) or powder is placed into an electrically conductive basket or other container containing the composition (molten salt) and two inert electrodes. The binary oxide pellets are large enough not to pass through the basket. The process of converting the binary oxide to the ternary oxide are similar as discussed above. To initiate the reaction, an oxide is introduced into the composition and a current is passed between the first and second inert electrodes through the electrically conductive basket. The current passing between the two electrodes causes the composition (molten salt) to react with the binary oxide pellets/powder in contact with the electrically conductive basket to produce a ternary oxide. As discussed previously, the thickness of the ternary oxide can be controlled and determined by knowing the current passing between the first electrode and the second electrode and the duration of the reaction.

In various embodiments, the substrate and/or other components of the present invention, including the ternary oxides, and layers and films thereof, can contain conventional amounts or higher amounts of dopants (e.g., about 10 ppm to about 100,000 ppm), like alkaline earth dopants, transition dopants, alkali dopants, rare earth dopants, nitrogen, oxygen, phosphorus, sulfur, boron, and the like, and combinations thereof.

In one embodiment of the present invention, the substrate is an anode wherein the binary oxide is present on the anode. The binary oxide can be formed on the anode by any suitable technique such as by an anodization process which occurs prior to the reacting of the binary oxide with a metal material to form the ternary oxide dielectric layer. Furthermore, the anode which contains the binary oxide and which ultimately is used to form the ternary oxide dielectric layer on the anode can subsequently be used as an anode in a capacitor using conventional capacitor designs. The capacitor can be a solid capacitor or a liquid filled capacitor. The present invention provides a very convenient way to form a ternary oxide dielectric layer on an anode or other surface which has a multitude of benefits as described herein.

The substrate having the ternary oxide film can be cleaned as described earlier. The perovskite ternary oxide dielectric layer is useful for capacitors and other devices, and in particular is useful with anode surfaces. Embodiments of the present invention include powder with a ternary oxide layer, preferably a metal powder, like Ta or Nb, with a ternary oxide layer as described earlier. The metal powder is preferably high surface area powder, such as at least a BET of about 0.5 $m^2/g$ or higher, and more preferably at least about 1.0 $m^2/g$, such as from about 1.0 $m^2/g$ to about 15 $m^2/g$ or more. The present invention further includes an anode or pressed article with the ternary oxide layer of the present invention. The layer is preferably a coherent, uniform, and/or continuous film. Details of the type of capacitor and anodes that can be used in the present invention or adapted for the present invention include U.S. Pat. Nos. 6,512,668; 6,500,763; 6,495,021; 6,479,857; 6,458,645; 6,432,161; 6,430,026; 6,423,110; 6,423,104; 5,580,367; 6,338,816; 6,348,113; 6,416,730; 6,420,043; 6,402,066; 6,380,577; 6,373,087; 6,358,625; 6,146,959; 6,046,081; 6,040,975; 5,986,877; 5,605,561; and 5,225,286, all incorporated in their entirety by reference herein.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of making a ternary oxide comprising:
    reacting a binary oxide with a metal material to form a ternary oxide dielectric layer on a substrate, wherein said metal material is different than said binary oxide, wherein said metal material is a metal oxide, a metal carbonate, a metal nitrate, a metal halide, a metal hydroxide, a metal fluoride, or combinations thereof, wherein said reacting comprises:

fusing said binary oxide with said metal material to form a solid material;

dissolving said solid material in a first solution;

disposing said first solution or a derivative of said first solution onto said substrate; and heating said substrate having said first solution disposed thereon or an evaporated film of the first solution disposed thereon under vacuum, wherein said binary oxide reacts with the metal material to produce a ternary oxide dielectric.

2. The method of claim 1, wherein said disposing comprises coating, spraying, dipping, exposing to vapors, or combinations thereof.

3. The method of claim 1, wherein said solid material comprises a fused material.

4. The method of claim 1, wherein said first solution comprises water.

5. The method of claim 1, wherein said substrate is a metal substrate.

6. The method of claim 1, wherein said substrate is a metal substrate heated to a temperature of from about 150° C. to about 1400° C.

7. The method of claim 1, wherein said substrate is a metal substrate heated to a temperature of from about 150° C. to about 1400° C. and for about 1 hour to about 36 hours.

* * * * *